US009515027B2

(12) United States Patent
Tamaki (10) Patent No.: US 9,515,027 B2
(45) Date of Patent: Dec. 6, 2016

(54) PRINTED CIRCUIT BOARD

(71) Applicant: CANON KABUSHIKI KAISHA, Tokyo (JP)

(72) Inventor: Hiroto Tamaki, Yashio (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 153 days.

(21) Appl. No.: 14/353,185

(22) PCT Filed: Dec. 6, 2012

(86) PCT No.: PCT/JP2012/082266
§ 371 (c)(1),
(2) Date: Apr. 21, 2014

(87) PCT Pub. No.: WO2013/085071
PCT Pub. Date: Jun. 13, 2013

(65) Prior Publication Data
US 2014/0247574 A1    Sep. 4, 2014

(30) Foreign Application Priority Data

Dec. 8, 2011   (JP) ................................ 2011-268724
Dec. 4, 2012   (JP) ................................ 2012-265210

(51) Int. Cl.
*H01L 23/552*    (2006.01)
*H05K 1/02*    (2006.01)
(Continued)

(52) U.S. Cl.
CPC ............ *H01L 23/552* (2013.01); *H01L 23/50* (2013.01); *H01L 23/642* (2013.01);
(Continued)

(58) Field of Classification Search
CPC ... H01L 23/552; H01L 23/64; H01L 23/642; H01L 2924/00; H01L 23/50; H01L 23/647; H01L 2924/0002; H05K 1/0225; H05K 1/0027; H05K 1/0231; H05K 1/0234; H05K 2201/093; H05K 1/0227; H05K 2201/09318
USPC ......... 174/255, 260–265; 361/760, 792–795, 361/772, 774, 763, 783
See application file for complete search history.

(56) References Cited

U.S. PATENT DOCUMENTS 5,183,972 A * 2/1993 Duane ................... H01L 23/145
                                                                174/251
(Continued)

FOREIGN PATENT DOCUMENTS

JP    H06-244562 A    9/1994

OTHER PUBLICATIONS

International Preliminary Report on Patentability dated Jun. 10, 2014 in PCT /JP2012/082266.
(Continued)

*Primary Examiner* — Jenny L Wagner
*Assistant Examiner* — Pete Lee
(74) *Attorney, Agent, or Firm* — Fitzpatrick, Cella, Harper & Scinto (57) ABSTRACT

A printed circuit board includes a printed circuit board, a semiconductor device mounted on the printed circuit board, a capacitor element mounted on the printed circuit board 2, a ground conductor plane to which a ground terminal of the semiconductor device is connected, and first and second power source conductor planes which are arranged so as not to contact with each other. The second power source conductor plane and the ground conductor plane are arranged so as to oppose to each other to form a planar capacitor. The printed circuit board has a first connecting conductor which connects a power source terminal of the semiconductor device with the second power source conductor plane, and a second connecting conductor which connects the first power source conductor plane with the second power source conductor plane through a first terminal of the capacitor element. Thereby, an electromagnetic radiation noise is reduced.

9 Claims, 8 Drawing Sheets

(51) Int. Cl.
*H01L 23/50* (2006.01)
*H01L 23/64* (2006.01)

(52) U.S. Cl.
CPC ......... *H01L 23/647* (2013.01); *H05K 1/0225* (2013.01); *H05K 1/0231* (2013.01); *H05K 1/0234* (2013.01); *H01L 2924/0002* (2013.01); *H05K 1/0227* (2013.01); *H05K 2201/09318* (2013.01)

(56) References Cited

U.S. PATENT DOCUMENTS

| | | | | |
|---|---|---|---|---|
| 6,596,948 | B1 * | 7/2003 | Haden | H05K 1/0231 174/255 |
| 7,175,249 | B2 | 2/2007 | Hongo et al. | |
| 7,594,105 | B2 * | 9/2009 | Ohsaka | G06F 1/188 29/825 |
| 7,780,257 | B2 | 8/2010 | Hongo et al. | |
| 8,253,025 | B2 * | 8/2012 | Kim | H05K 1/0233 174/250 |
| 8,618,632 | B2 * | 12/2013 | Kawashima | H01L 23/50 257/532 |
| 2001/0035799 | A1 | 11/2001 | Ueno | |
| 2003/0151905 | A1 * | 8/2003 | Gottlieb | H05K 1/116 361/780 |
| 2005/0092520 | A1 | 5/2005 | Chao et al. | |
| 2006/0151205 | A1 * | 7/2006 | Lim | H05K 1/0231 174/260 |
| 2007/0144770 | A1 * | 6/2007 | Nakao | H05K 1/0225 174/260 |
| 2007/0291459 | A1 | 12/2007 | Hsu | |

OTHER PUBLICATIONS

PCT International Search Report and Written Opinion of the International Searching Authority, mailed Jun. 12, 2013 in PCT/JP2012/082266.

* cited by examiner

PRINTED CIRCUIT BOARD

This application is a national stage application under 35 U.S.C. §371 of International Application No. PCT/JP2012/082266, having an International filing date of Dec. 6, 2012, which claims priority to Japan 2012-265210, filed on Dec. 4, 2012 and Japan 2011-268724, filed on Dec. 8, 2011, the contents of each of which are incorporated by reference as if set forth in full herein.

TECHNICAL FIELD

The present invention relates to a printed circuit board to be used in electronic equipment.

BACKGROUND ART

In recent years, a requirement for a digital electronic equipment to have a higher performance is boundless, and a semiconductor integrated circuit (IC/LSI) which is mounted on a printed circuit board and is used as a semiconductor device tends to be more highly integrated and use higher frequency. For this reason, the number of simultaneous switching buffers in the IC/LSI tends to increase, a larger electric current tends to be required, and the switching cycle also tends to become higher frequency. In order to stably operate the IC/LSI mounted on this printed circuit board, a charge supplying function which follows a high-speed operation of the IC/LSI needs to be provided on the printed circuit board. This charge supplying function for the IC/LSI is achieved by a capacitative element connected to the IC/LSI through a wiring or a planate conductor formed on the printed circuit board.

However, in a high-frequency band, impedance cannot be neglected which originates in parasitic components of the wiring and the planate conductor, and accordingly, potential fluctuations of a power source and a ground are induced by an electric current for supplying an electric charge to the IC/LSI. Furthermore, a cable is connected to a connector mounted on the printed circuit board. The cable connected to this printed circuit board works as an antenna, and results in contributing to emanation of an electromagnetic noise. For this reason, in order to reduce the electromagnetic radiation noise, it becomes important to make the potential fluctuations of the power source and the ground occurring with the high-speed operation of the IC/LSI mounted on the printed circuit board not to propagate to the position of the connector arranged on the printed circuit board.

On the other hand, the electromagnetic radiation noise generated in these electronic equipments can become not only a cause of inducing a malfunction of a self-circuit, but also a cause of inducing a malfunction of other electronic equipment. For this reason, in order to market an electronic product, the electromagnetic radiation noise must be suppressed within a regulation value concerning an electromagnetic radiation noise such as VCCI, CISPR and FCC in each country.

Then, PTL 1 describes a technology of reducing the electromagnetic radiation noise by separating the electrodes into a planate power source electrode to which a power source is connected and a power source electrode for the LSI which is connected to the semiconductor device, and reducing the amount of a noise current flowing from the power source electrode for the LSI to the power source electrode.

Figure 8:
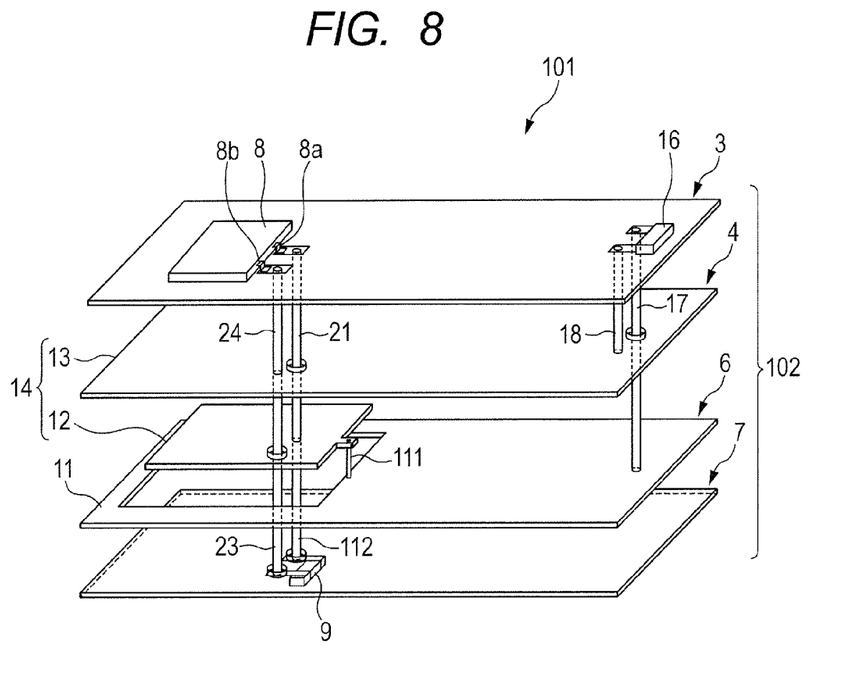
FIG. 8 is an exploded perspective view illustrating a conventional printed circuit board.

FIG. 8 is an exploded perspective view illustrating a conventional printed circuit board. In the conventional printed circuit board 101, one surface of a printed circuit board 102 is determined to be a first wiring layer 3, and the other surface is determined to be a fourth wiring layer 7. A second wiring layer 4 having a ground conductor plane 13 and a third wiring layer 6 having first and second power source conductor planes 11 and 12 are provided between these first wiring layer 3 and fourth wiring layer 7 through a not-shown dielectric layer.

A semiconductor device 8 is provided on the first wiring layer 3. In addition, a connector 16 to which a not-shown power source cable of a direct-current power source is connected is provided on the first wiring layer 3, and a terminal of the connector 16 is connected to the first power source conductor plane 11 and the ground conductor plane 13 through connecting conductors 17 and 18 of a via or the like. The first power source conductor plane 11 and the second power source conductor plane 12 are connected to each other by a connecting conductor 111 of the via or the like. The power source terminal 8a of the semiconductor device 8 and the second power source conductor plane 12 are connected to each other by a connecting conductor 21 of the via or the like, and the ground terminal 8b of the semiconductor device 8 and the ground conductor plane 13 are connected to each other by a connecting conductor 24 of the via or the like. By connecting the direct-current power source to the connector 16, the electric power is supplied to the semiconductor device 8 through the connecting conductor 17, the first power source conductor plane 11, the connecting conductor 111, the second power source conductor plane 12 and the connecting conductor 21.

In this conventional printed circuit board 101, the power source conductor plane is separated into the first power source conductor plane 11 and the second power source conductor plane 12, and the conductor planes are connected to each other by a connecting conductor 111 of the via or the like, thereby intending to reduce the amount of the noise current flowing into the first power source conductor plane 11, which has been generated in the semiconductor device 8 and has reached the second power source conductor plane 12. In addition, a planar capacitor 14 is formed by arranging the second power source conductor plane 12 and the ground conductor plane 13 so as to closely face each other. Thereby, the noise current which has been generated in the semiconductor device 8 and has reached the second power source conductor plane 12 returns to the semiconductor device 8 through a path formed by the planar capacitor 14 and the connecting conductor 24.

Furthermore, in the printed circuit board 101, a capacitor element 9 which is a bypass capacitor is mounted on the fourth wiring layer 7, and the capacitor element 9 is connected between the second power source conductor plane 12 and the ground conductor plane 13 through the connecting conductors 112 and 23 of the via or the like. Thereby, the remainder of the noise current except for a noise current which has not returned to the planar capacitor 14 returns to the semiconductor device 8 through a path formed by the connecting conductor 112, the capacitor element 9, the connecting conductor 23, the ground conductor plane 13 and the connecting conductor 24.

In other words, intention is made to reduce the electromagnetic radiation noise by increasing the total electrostatic capacitance by the planar capacitor 14 and the capacitor element 9, and returning the noise current which has been generated in the semiconductor device 8 to the semiconductor device 8 through the planar capacitor 14 and the capacitor element 9.

However, in recent years, the semiconductor device such as the IC/LSI progressively tends to use a higher frequency, a conventional configuration is insufficient to reduce the electromagnetic radiation noise originating in the noise current of high frequency generated in the semiconductor device, and has been required to be further improved.

In other words, in the conventional configuration illustrated in FIG. 8, the path of the noise current includes a path in which the noise current leaks to the first power source conductor plane 11 from a branch point of the second power source conductor plane 12 through the connecting conductor 111, in addition to a path in which the noise current reaches the semiconductor device 8 from the branch point through the planar capacitor 14 or the capacitor element 9. The noise current which has leaked to the first power source conductor plane 11 passes through a not-shown cable via the connector 16, and accordingly, becomes a cause of the electromagnetic radiation noise.

A method of enlarging the second power source conductor plane is considered in order to reduce the noise current which leaks to the first power source conductor plane and efficiently return the noise current to the semiconductor device by the planar capacitor, but there is a limit on the enlargement of the second power source conductor plane because the size of the printed circuit board is restricted.

In addition, there are an inductance component of the connecting conductor 112, an equivalent serial inductance (ESL) component of the capacitor element 9 and inductance components of the connecting conductors 23 and 24, in a path which reaches the semiconductor device 8 from the branch point through the capacitor element 9. For this reason, in order to reduce the amount of the noise current which flows out from the branch point to the first power source conductor plane 11, it is necessary to decrease the inductance components existing in the path which reaches the semiconductor device 8 from the branch point through the capacitor element 9.

CITATION LIST

Patent Literature

PTL 1: Japanese Patent Application Laid-Open No. H06-244562

SUMMARY OF INVENTION

For this reason, an object of the present invention is to provide a printed circuit board which efficiently returns a noise current to a semiconductor device by a capacitor element mounted on the printed circuit board and a planar capacitor formed in the printed circuit board, and can reduce a noise to be emanated.

According to one aspect of the present invention, a printed circuit board comprising: a semiconductor device having a power source terminal and a ground terminal; (A) a printed wiring board on which the semiconductor device is mounted, wherein the printed wiring board comprises a first wiring layer formed, as being a first surface layer of the printed wiring board, on which the semiconductor device is mounted, a second wiring layer having a first ground conductor plane to which a ground terminal is connected, a third wiring layer formed from at least one layer having a first power source conductor plane to which a direct power source voltage is applied, and a second power source conductor plane arranged so as not to contact with the first power source conductor plane in opposition to the first ground conductor plane, such that the second power source conductor plane and the first ground conductor plane form a planner capacitor, and a fourth wiring layer forming on the printed wiring board at a second surface layer which is a back side surface of the first surface layer; and (B) a capacitor element mounted on the fourth wiring layer, and connected electrically to a first terminal connected electrically to the power source terminal and a second terminal connected electrically to the ground terminal, wherein the power source terminal and the second power source conductor plane are connected through a first connecting conductor, the second power source conductor plane and the first power source conductor plane are connected through a second connecting conductor, the capacitor element has a first terminal electrically connected to the second connecting conductor, and has a second electrically connected through a third connecting conductor to the first ground conductor plane, and the semiconductor device has a ground terminal electrically connected through a fourth connecting conductor to the first ground conductor plane.

In the printed circuit board according to the present invention, the second power source conductor plane opposes to the ground conductor plane, and thereby the second power source conductor plane and the ground conductor plane form the planar capacitor. Accordingly, a part of the noise current which has been flowed out from the power source terminal of the semiconductor device and has reached the second power source conductor plane through the first connecting conductor is returned to the ground terminal of the semiconductor device through the planar capacitor. At this time, the first power source conductor plane and the second power source conductor plane are connected to each other by the second connecting conductor which passes through a first terminal of the capacitor element, and accordingly, the inductance between the first power source conductor plane and the second power source conductor plane becomes higher than that in a conventional one. Accordingly, the noise current is efficiently directly passed to the ground terminal through the planar capacitor due to a difference of the impedance between the planar capacitor and the second connecting conductor, and the electromagnetic radiation noise can be effectively reduced.

In addition, the first and second power source conductor planes do not contact with each other, and accordingly, the remainder of the noise current which has reached the second power source conductor plane results in being split into the capacitor element side and the first power source conductor plane side at the first terminal of the capacitor element. In this way, the first terminal of the capacitor element becomes the branch point of the noise current, and accordingly, the inductance of the path between the branch point and the ground terminal of the semiconductor device can be lowered than that in a conventional one. Accordingly, most of the noise current which has reached the branch point is directly passed to the ground terminal through the capacitor element, and accordingly, the electromagnetic radiation noise can be effectively reduced.

Further features of the present invention will become apparent from the following description of exemplary embodiments with reference to the attached drawings.

DESCRIPTION OF EMBODIMENTS

Figure 1:
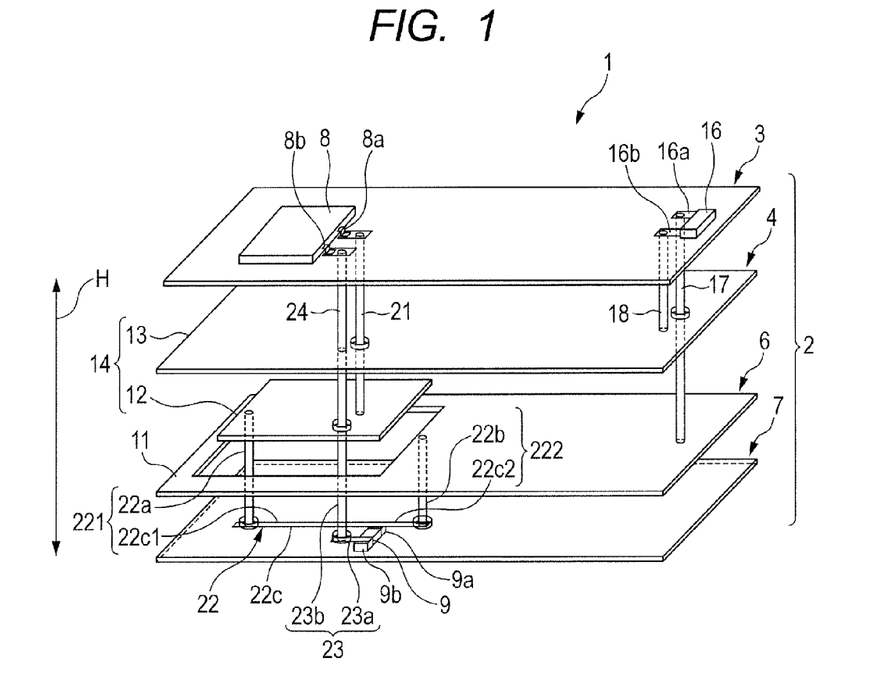
FIG. 1 is an exploded perspective view illustrating a printed circuit board of the present invention.

The mode for carrying out the present invention will be described in detail below with reference to the drawings. FIG. 1 is an exploded perspective view illustrating a printed circuit board according to an embodiment of the present invention.

The printed circuit board 1 illustrated in FIG. 1 is a so-called multilayer printed circuit board. The printed circuit board 1 includes a printed circuit board 2, a semiconductor device 8 mounted on the printed circuit board 2, and a capacitor element (chip capacitor in the present embodiment) 9 mounted on the printed circuit board 2. The printed circuit board 1 also includes a connector 16 mounted on the printed circuit board 2.

The semiconductor device 8 is an integrated circuit such as an IC and an LSI, and has a power source terminal 8a and a ground terminal 8b. A direct-current voltage is applied between the power source terminal 8a and the ground terminal 8b, and an electric power is supplied to the semiconductor device 8. A not-shown power source cable of a direct-current power source is connected to the connector 16.

The capacitor element 9 is a bypass capacitor which is connected between the power source terminal 8a and the ground terminal 8b of the semiconductor device 8, and directly pass (high-frequency current, in other words, noise current) to the ground terminal 8b from the power source terminal 8a.

The printed circuit board 2 has a first wiring layer 3 which is one surface layer, and a fourth wiring layer 7 which is a back side surface layer positioned on the surface that faces to the first wiring layer 3. The printed circuit board 2 has a second wiring layer 4 having a ground conductor formed therein and a third wiring layer 6 having a power source conductor formed therein provided between the first wiring layer 3 and the fourth wiring layer 7, and the layers are stacked on each other through dielectric layers (not-shown), respectively.

For information, the printed circuit board according to the present invention is not limited to the above described four-layer configuration, but also may have a three-layer configuration in which the first wiring layer and the second wiring layer are shared, or may have a five or more-layer configuration. Incidentally, in the present invention, the second wiring layer 4 having the ground conductor formed therein is a conductor layer having a relatively larger area of the conductor having the ground potential than those of other conductor layers. Accordingly, the second wiring layer 4 may be provided with a wiring and a conductor plane having a power source potential, and a signal wiring having other potential than the ground potential and the power source potential, in addition to the wiring and the conductor plane having the ground potential. In addition, the ground layer is not limited to one layer, but a plurality of ground layers may also be provided.

In addition, in the present invention, the third wiring layer 6 having the power source conductor formed therein is a conductor layer having a relatively larger area of the conductor having a power source potential than those of other conductor layers. Accordingly, the third wiring layer 6 may be provided with the wiring and the conductor plane having the ground potential, and a signal wiring having other potential than the ground potential and the power source potential, in addition to the wiring and the conductor plane having the power source potential. The third wiring layer 4 is not limited to one layer, but a plurality of wiring layers may also be provided.

In addition, in the present invention, a wiring layer means a conductor layer except the above-described ground conductor layer and the power source conductor layer. The surface layer and the back side surface layer of the multilayer printed circuit board are usually used as the wiring layer in many cases, but the wiring layer may also be provided in the inner layer. In addition, the wiring layer may also be provided with the wiring and the conductor plane having the power source potential or the ground potential, in addition to the wiring for transmitting a signal.

The third wiring layer 6 is provided with two power source conductor planes 11 and 12 which are separated from each other. The ground conductor layer 4 is provided with a ground conductor plane 13.

The first power source conductor plane 11 and the second power source conductor plane 12 are arranged so as not to contact with each other, in other words, arranged with a space from each other. In addition, the first power source conductor plane 11 and the second power source conductor plane 12 are arranged so as to deviate from each other in a lamination direction (arrow H direction). Furthermore, the second power source conductor plane 12 is arranged so as to be closer to the ground conductor plane 13 than the first power source conductor plane 11, and is arranged so as to oppose to the ground conductor plane 13.

The second power source conductor plane 12 is arranged at a position opposing to the semiconductor device 8. In the present embodiment, the second power source conductor plane 12 is formed so as to have a size which includes a range of a projecting image formed when the semiconductor device 8 has been projected in the lamination direction (arrow H direction) of the printed circuit board 2. In addition, the first power source conductor plane 11 has an aperture portion larger than the projecting image which is formed when the second power source conductor plane 12 has been projected in the lamination direction (arrow H direction) formed therein so that the projecting image does not overlap with the aperture portion. However, the aperture portion is provided so that the first power source conductor plane 11 and the second power source conductor plane 12 have a space therebetween, and accordingly, when each of the power source conductor planes is not formed in the same layer, the aperture portion does not necessarily need to be formed in the first power source conductor plane 11.

Here, a layer formed of a resin, a glass fiber or the like, for instance, is used for not-shown each dielectric layer. The second power source conductor plane 12 and the ground conductor plane 13 are arranged so as to face to each other while sandwiching the dielectric layer, and form a planar capacitor 14. The condition of the planar capacitor according to the present invention is that the dielectric layer arranged between the second power source conductor plane 12 and the ground conductor plane 13 has a thickness of less than 200 μm, or is formed from a material having a dielectric constant of 4.2 or more, or the planar capacitor satisfies both of the conditions.

The first wiring layer 3 has a land for a first power source terminal and a land for a first ground terminal which mount the semiconductor device 8 formed thereon, has the semiconductor device 8 and the connector 16 mounted thereon, and is also provided with a not-shown signal wiring, a power source wire, a ground wire and the like. In addition, the fourth wiring layer 7 has a land for a second power source terminal and a land for a second ground terminal which mount the capacitor element 9 formed thereon, has the capacitor element 9 mounted thereon, and is also provided with a not-shown wiring pattern and electronic parts. Incidentally, when the capacitor element 9 and a resistor element are serially arranged as in Embodiment 2, which will be described later, the land for the second power source terminal and the land for the second ground terminal have any one of the capacitor element and the resistor element mounted thereon.

The connector 16 has a power source terminal 16a and a ground terminal 16b. The power source terminal 16a is connected to the first power source conductor plane 11 through a via (connecting conductor) 17, and the ground terminal 16b is connected to the ground conductor plane 13 through a via (connecting conductor) 18. Thereby, a direct-current power source voltage is applied to the first power source conductor plane 11 with reference to the ground conductor plane 13.

The power source terminal 8a of the semiconductor device 8 and the second power source conductor plane 12 are connected to each other by a first via 21 which is a first connecting conductor.

The first power source conductor plane 11 and the second power source conductor plane 12 are connected to each other by a second connecting conductor 22. In the present embodiment, the second connecting conductor 22 connects the first power source conductor plane 11 with the second power source conductor plane 12 through a first terminal 9a of the capacitor element 9. The second connecting conductor 22 is formed of a first connection portion 221 which extends from the second power source conductor plane 12 to the first terminal 9a of the capacitor element 9, and a second connection portion 222 which extends from the first terminal 9a to the first power source conductor plane 11.

The first connection portion 221 has a second via 22a which extends from the second power source conductor plane 12 to the fourth wiring layer 7; and a first wiring pattern 22c1 which is formed on the fourth wiring layer 7, one end of which is connected to the second via 22a, and the other end of which is connected to the first terminal 9a of the capacitor element 9.

The second connection portion 222 has a third via 22b which extends from the first power source conductor plane 11 to the fourth wiring layer 7; and a second wiring pattern 22c2 which is formed on the fourth wiring layer 7, one end of which is connected to the first terminal 9a of the capacitor element 9, and the other end of which is connected to the third via 22b. Incidentally, in the present embodiment, the first wiring pattern 22c1 and the second wiring pattern 22c2 are connected to each other, and form one wiring pattern 22c.

In addition, the second terminal 9b of the capacitor element 9 and the ground conductor plane 13 are connected to each other by a third connecting conductor 23. The third connecting conductor 23 has a wiring pattern 23a which is formed on the fourth wiring layer 7 and one end of which is connected to the second terminal 9b of the capacitor element 9, and a fourth via 23b which is connected to the other end of the wiring pattern 23a and the ground conductor plane 13.

In addition, the ground conductor plane 13 and the ground terminal 8b of the semiconductor device 8 are connected to each other by a fifth via 24 which functions as a fourth connecting conductor. Incidentally, the fourth via 23b and the fifth via 24 are one via which penetrates the printed circuit board 2, but may also be different vias.

In the above-described wiring configuration, the ground terminal 8b of the semiconductor device 8 is connected to the ground conductor plane 13 through the fifth via 24, and the power source terminal 8a of the semiconductor device 8 is connected to the second power source conductor plane 12 through the first via 21. The first terminal 9a of the capacitor element 9 is connected to the power source terminal 8a of the semiconductor device 8 through the first connection portion 221, the second power source conductor plane 12 and the first via 21, and is also connected to the first power source conductor plane 11 through the second connection portion 222. In addition, the second terminal 9b of the capacitor element 9 is connected to the ground terminal 8b of the semiconductor device 8 through the third connecting conductor 23 and the via 24.

In addition, the power source terminal 16a of the connector 16 is connected to the power source terminal 8a of the semiconductor device 8 through the via 17, the first power source conductor plane 11, the second connecting conductor 22, the second power source conductor plane 12 and the first via 21. In addition, the ground terminal 16b of the connector 16 is connected to the ground terminal 8b of the semiconductor device 8 through the via 18, the ground conductor plane 13 and the via 24.

In other words, the direct-current power source voltage is applied to the first power source conductor plane 11 from the connector 16, thereby the direct-current voltage is applied to the power source terminal 8a of the semiconductor device 8 through the second connecting conductor 22, the second power source conductor plane 12 and the first via 21, and the electric power results in being capable of being supplied to the semiconductor device 8. Thereby, the electric power is supplied to the semiconductor device 8 from an external direct-current power source through the connector 16, and the semiconductor device 8 operates.

Here, when the semiconductor device 8 operates, the noise current is generated along with this operation, and the noise current is flowed out from the power source terminal 8a of the semiconductor device 8.

Figure 2A:
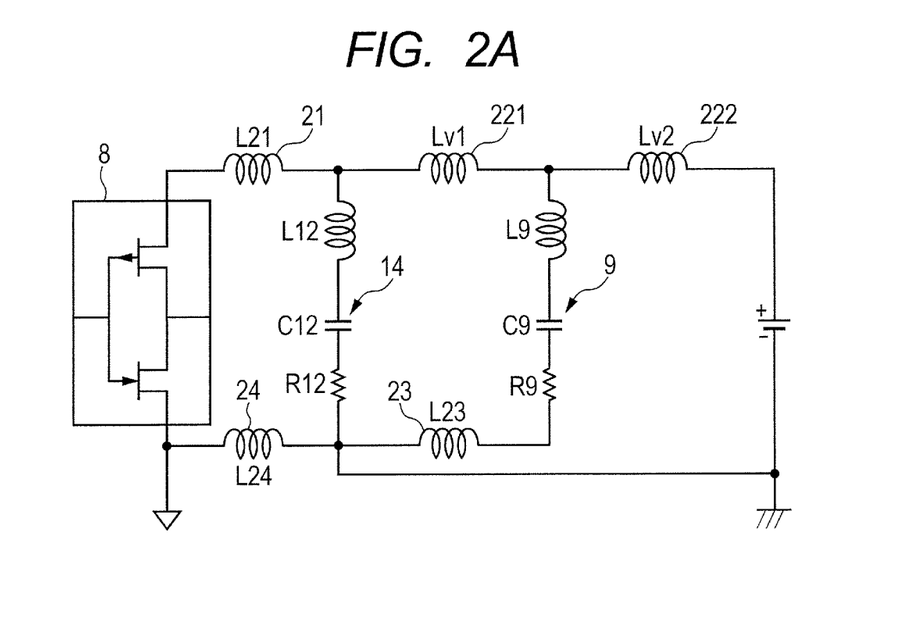
FIGS. 2A and 2B are circuit diagrams illustrating an equivalent circuit of the printed circuit board of the present invention.

FIG. 2A is a view illustrating an equivalent circuit of the printed circuit board 1. In FIG. 2A, the parasitic inductances of the second power source conductor plane 12, the first via 21, the third connecting conductor 23 and the fifth via 24 are shown as L12, L21, L23 and L24, respectively, and the equivalent serial inductance (ESL) of the capacitor element 9 is shown as L9.

The electrostatic capacitance of the capacitor element 9 is shown as C9, and the electrostatic capacitance of the planar capacitor 14 is shown as C12, which is formed by the second power source conductor plane 12 and the ground conductor plane 13. The equivalent serial resistance (ESR) of the capacitor element 9 is shown as R9, and the resistance component of the second power source conductor plane 12 is shown as R12. Furthermore, the parasitic inductance of the first connection portion 221 is shown as Lv1, and the parasitic inductance of the second connection portion 222 is shown as Lv2.

Here, when the capacitor element 9 has, for instance, a size 1005 (length of 1.0 mm and width of 0.5 mm) or a size 1608 (length of 1.6 mm and width of 0.8 mm) and a capacitance of 0.1 μF, C9 is approximately 0.1 μF, L9 is approximately 0.5 nH and R9 is approximately 30 mΩ.

At this time, at the frequency of 500 MHz, the impedance of C9 becomes approximately 3 mΩ, the impedance of L9 becomes approximately 1.6Ω, and the impedance of R9 becomes approximately 30 mΩ. From these results, it is understood that the impedances of C9 and R9 are smaller than the impedance of L9. Furthermore, because the impedance originating from the inductance increases in proportion to the frequency, C9 and R9 can be omitted in the frequency band of 500 MHz or more. Furthermore, because R12 is a resistance of a conductor plane, R12 becomes a much smaller value than that of the ESR of the capacitor element 9, and accordingly, the resistance can be neglected.

Figure 2B:
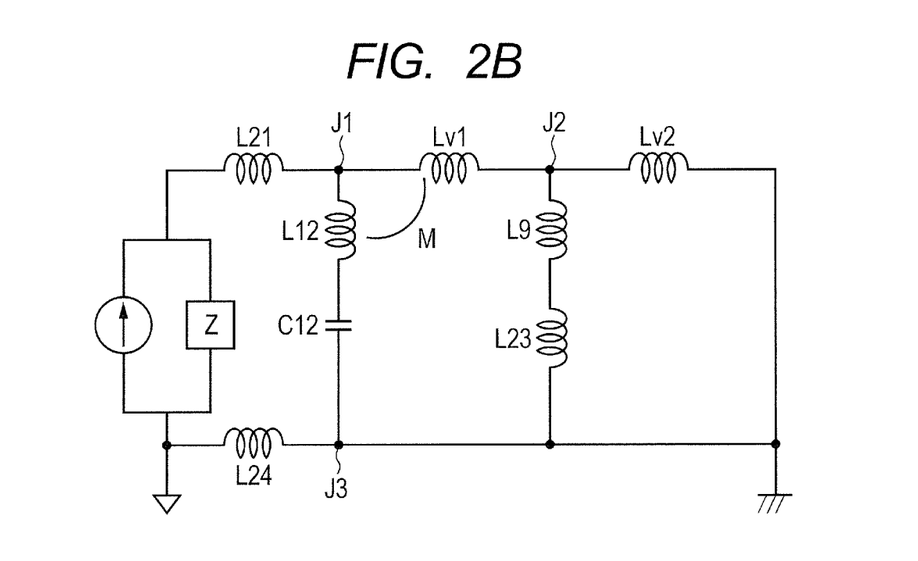

Accordingly, the equivalent circuit of FIG. 2A can be simplified to be a high-frequency equivalent circuit as illustrated in FIG. 2B. Here, a mechanism how the high-frequency noise current passes and is reduced will be described in detail below with reference to FIG. 2B.

The semiconductor device 8 can be expressed by a noise current source and the output impedance between the power source and the ground. The noise current which has been generated in the semiconductor device 8 is firstly split out into an electric current which directly passes through the planar capacitor 14 that is formed of the second power source conductor plane 12 and the ground conductor plane 13, and an electric current which leaks to the capacitor element 9 side, at a branch point J1. The electric current which has leaked to the capacitor element 9 side passes through the first connection portion 221 of the second connecting conductor 22, and reaches a branch point J2 which is the first terminal 9a of the capacitor element 9. The noise current which has reached this branch point J2 is split out into an electric current which directly passes to the capacitor element 9, and an electric current which leaks to the first power source conductor plane 11 side through the inductance Lv2 of the second connection portion 222 of the second connecting conductor 22.

At this time, in order to make the electric current which leaks to the first power source conductor plane 11 as small as possible, the inductance Lv2 of the second connection portion 222 may be determined to become larger than the sum of the ESL (L9) of the capacitor element 9 and the inductance (L23) of the third connecting conductor 23. Then, a unit for increasing the impedance of Lv2 is provided which can achieve the increased impedance of Lv2 by decreasing a wiring width of the second wiring pattern 22c2 or elongating the wiring length thereof. Alternatively, a chip inductance may also be serially added to the second wiring pattern 22c2.

Furthermore, in order to directly pass a noise current to the planar capacitor 14 as much as possible, it is necessary to connect the branch point J1 with the first terminal 9a of the capacitor element 9 by a connection unit having a higher impedance than that of the planar capacitor 14 and decouple the noise current so as not to flow.

Here, the inductance which functions as a decoupling unit at the branch point J1 is expressed as Expression (1)

$$L = Lv1 + (L9 + L23)//(Lv2) \qquad (1)$$

In other words, the inductance Lv2 of the second connection portion 222 is connected in parallel to the serial connection of the equivalent serial inductance L9 of the capacitor element 9 and the inductance L23 of the third connecting conductor 23. The serially synthesized inductance of the synthesized inductance of the above and the inductance Lv1 of the first connection portion 221 functions as an impedance which decouples the noise current that passes through the planar capacitor 14.

Here, the impedance from the branch point J2 to the branch point J3 becomes a small impedance because of being a parallel connection of the inductance. For this reason, it becomes important that the impedance originating from the inductance Lv1 of the first connection portion 221 is larger than the impedance of the planar capacitor 14. Then, the impedance of the first connection portion 221 can be enhanced by a method of extending the first wiring pattern 22c1 and utilizing the inductance of the first wiring pattern 22c1. For information, a chip inductance may also be serially arranged with respect to the first wiring pattern 22c1.

Incidentally, when the first wiring pattern 22c1 is extended, the second power source conductor plane 12 and the first wiring pattern 22c1 are occasionally arranged so as to face to each other. When the second power source conductor plane 12 and the first wiring pattern 22c1 are arranged so as to face to each other, a mutual inductance M between the second power source conductor plane 12 and the first wiring pattern 22c1 cannot be neglected.

For this reason, the direction of the second via when viewed from the above-described first via in the second power source conductor plane is determined to be opposite to the direction of the third via when viewed from the above-described second via in the above-described wiring pattern. In other words, the first wiring pattern 22c1 is arranged so that the direction of the noise current flowing from the first via 21 toward the second via 22a in the second power source conductor plane 12 becomes opposite to the direction of the noise current flowing through the first wiring pattern 22c1 and the first wiring pattern 22c2. In other words, the position at which the second via 22a is formed and the position at which the capacitor element 9 is arranged are set so that the direction of the noise current flowing from the second via 22a toward the first terminal 9a of the capacitor element 9 in the fourth wiring layer 7 becomes opposite to the direction of the noise current flowing from the first via 21 toward the second via 22a in the second power source conductor plane 12. The first wiring pattern 22c1 is arranged in a position in which the second via 22a and the first terminal 9a of the capacitor element 9 are connected to each other. Thereby, the flow of the noise current which flows through the second power source conductor plane 12 and directly flows to the planar capacitor 14 is not obstructed by the noise current passing through the first wiring pattern 22c1.

As has been described above, in the present embodiment, the second power source conductor plane 12 and the first power source conductor plane 11 are connected to each other by the second connecting conductor 22 which passes through the first terminal 9a of the capacitor element 9. Thereby, the electric current which directly passes through the planar capacitor 14 and the capacitor element 9 increases more than that in the case in which the second power source conductor plane 12 and the first power source conductor plane 11 are serially connected to each other by a via or the like as in a conventional example, and accordingly, the noise can be reduced which results in diffusing to the whole printed circuit board 1.

In other words, the second power source conductor plane 12 opposes to the ground conductor plane 13, and thereby the second power source conductor plane 12 and the ground conductor plane 13 form the planar capacitor 14. Accordingly, a part of the noise current which has been flowed out from the power source terminal 8a of the semiconductor device 8 and has reached the second power source conductor plane 12 through the first via 21 is returned to the ground terminal 8b of the semiconductor device 8 through the planar capacitor 14. Thus, the planar capacitor 14 functions as a bypass capacitor. At this time, the first power source conductor plane 11 and the second power source conductor plane 12 are connected to each other by the second connecting conductor 22 which passes through the first terminal 9a of the capacitor element 9, and accordingly, the inductance between the first power source conductor plane 11 and the second power source conductor plane 12 becomes higher than that in a conventional case. In other words, the impedance shown when the second connecting conductor 22 side is viewed from the branch point J1 becomes higher than that in a conventional case. Accordingly, the impedance of the second connecting conductor 22 with respect to the planar capacitor 14 becomes higher than that in a conventional case, and the noise current is efficiently directly passed to the ground terminal 8b of the semiconductor device 8 through the planar capacitor 14.

In addition, the impedance of the second connecting conductor 22 (particularly, the first connection portion 221) is set at a higher value than that of the planar capacitor 14, and thereby the noise current can be more effectively directly passed to the ground terminal 8b of semiconductor device 8 by the planar capacitor 14.

Furthermore, the first and second power source conductor planes 11 and 12 do not contact with each other, and accordingly, the remainder of the noise current which has reached the second power source conductor plane 12 is guided to the first terminal 9a of the capacitor element 9 by the first connection portion 221 of the second connecting conductor 22. The noise current which has reached the first terminal 9a of the capacitor element 9 is split into the capacitor element 9 side and the first power source conductor plane 11 side, at the branch point J2 being the first terminal 9a. Thus, the first terminal 9a of the capacitor element 9 becomes the branch point J2 of the noise current, and accordingly, the inductance of the path which passes through the capacitor element 9 between the branch point and the ground terminal 8b of the semiconductor device 8 can be lowered compared with the conventional case. Accordingly, most of the noise current which has reached the branch point J2 is directly passed to the ground terminal 8b of the semiconductor device 8 through the capacitor element 9.

In other words, the printed circuit board in the present embodiment functions as a multistage noise filter using the impedance difference between the planar capacitor 14 and the first connection portion 221 of the second connecting conductor 22, and the impedance difference between the capacitor element 9 and the second connection portion 222 of the second connecting conductor 22.

Accordingly, the printed circuit board of the present embodiment can effectively reduce not only a noise which is emanated from the printed circuit board 1 itself that works as an antenna, but also the noise current which propagates to a not-shown cable through the connector 16 (see FIG. 1) that is arranged in the substrate end side and the like. Thereby, an electromagnetic radiation noise can be effectively reduced which is emanated from a not-shown cable or a housing that functions as the antenna. The electromagnetic radiation noise can be reduced particularly in the frequency band of 500 MHz or more.

In addition, in the present embodiment, the direction of the electric current flowing in the second power source conductor plane 12 and the direction of the electric current flowing in a wiring pattern 22c (particularly, the first wiring pattern 22c1) become opposite to each other. Accordingly, it can be reduced that the noise current is hindered from passing through the second power source conductor plane 12, in other words, the planar capacitor 14, and the noise current is efficiently directly passed to the planar capacitor 14. Accordingly, the propagation of the noise to the whole printed circuit board can be reduced, and the electromagnetic radiation noise can be more effectively reduced.

Incidentally, in the above-described embodiment, the multilayer printed circuit board 1 having the five-layer structure was described, but it is apparent that a similar effect can be obtained by applying the structure of the above-described embodiment to a printed circuit board, even when the number of the layers is different from that in the embodiment. In addition, when the semiconductor device 8 needs a plurality of different power sources, it is apparent that the second power source conductor plane 12 and the first power source conductor plane 11 which are arranged in the power feed portion of the semiconductor device 8 are configured in a plurality of sets.

In addition, in the above-described embodiment, of the third wiring layer 6 and the ground conductor layer 4, the layer closer to the wiring layer 3 which has the semiconductor device 8 mounted thereon is the ground conductor layer 4, but may be the third wiring layer 6. Furthermore, the first power source conductor plane 11 of the third wiring layer 6 may be formed of a wiring pattern, and may be formed in the same plane layer as the second power source conductor plane 12, as long as the first power source conductor plane 11 is not connected with the second power source conductor plane 12 by wirings or the like on the same plane.

In addition, in the above-described embodiment, the capacitor element 9 is mounted on the other surface in the opposite side to one surface of the printed circuit board 2, which has the semiconductor device 8 mounted thereon, in other words, on the fourth wiring layer 7 of the printed circuit board 2, but may also be mounted on one surface of the printed circuit board 2, in other words, on the first wiring layer 3. In addition, in the present embodiment, the direct-current power source is supplied to the semiconductor device 8 by the power source cable which is connected to the connector 16, but may also be supplied by a power source circuit provided on the printed circuit board 1.

EXAMPLE

Example 1

Figure 3A:
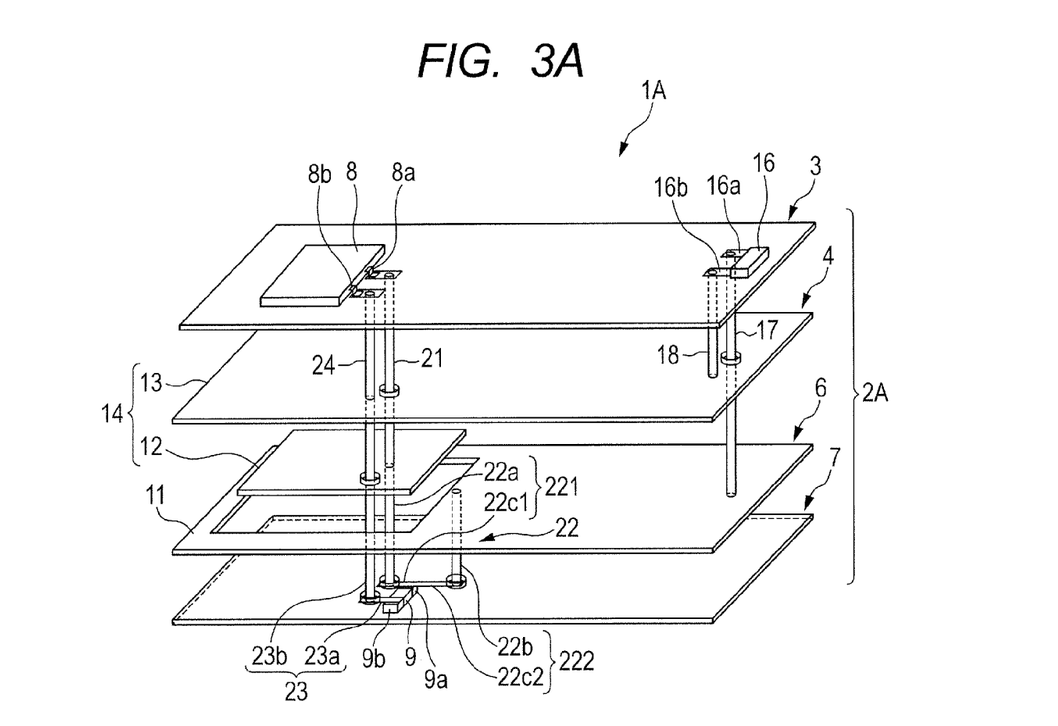
FIGS. 3A and 3B are respectively an exploded perspective view illustrating a printed circuit board according to Embodiment 1, and a graph illustrating a simulation result.

In order to verify an effect of the above-described embodiment, a simulation was performed by using an electromagnetic field simulator MW-Studio (made by CST AG). FIG. 3A is an exploded perspective view illustrating a printed circuit board according to Embodiment 1 of the present invention, and Embodiment 1 will be described below with reference to FIG. 3A. Incidentally, configurations similar to those in the above-described embodiment are designated by the same reference numerals, and the detailed description will be omitted. The printed circuit board 2A of the printed circuit board 1A which was used for the simulation has a rectangular shape with a short side of 6 cm and a long side of 8 cm.

The thicknesses of the wiring pattern of the first wiring layer 3, the ground conductor plane 13 of the ground conductor layer 4, the first and second power source conductor planes 11 and 12 of the third wiring layer 6, and the wiring pattern of the fourth wiring layer 7 are 20 μm, and are formed from copper. In addition, dielectric layers having a dielectric constant of 4.25 are arranged between each of the conductor layers.

As for the thickness of each dielectric arranged between each of the planar conductor layers, the thickness of a dielectric between the first wiring layer 3 and the ground conductor plane 13 is 0.1 mm, and the thickness of a dielectric between the ground conductor plane 13 and the second power source conductor plane 12 is 0.1 mm. In addition, the thickness of a dielectric between the second power source conductor plane 12 and the first power source conductor plane 11 is 0.5 mm, and the thickness of a dielectric between the first power source conductor plane 11 and the fourth wiring layer 7 is 300 μm.

The second power source conductor plane 12 has a square shape with one side of 20 mm. All of the vias have a columnar shape with a diameter of 0.6 mm, and when the vias were not connected to each of the planar conductor layers, the via was insulated from each of the planar conductor layers by having a space of 0.1 mm provided between the via and the planar conductor layer.

Comparative Example

In addition, in order to confirm the effect of reducing noise propagation in Embodiment 1, the simulation of the printed circuit board 101 illustrated in FIG. 8 was simultaneously performed, which was employed as a comparative example corresponding to a conventional art. A point of difference between the conventional printed circuit board 101 and the printed circuit board 1A in Embodiment 1 will be described below. In the conventional printed circuit board 101, the second power source conductor plane 12 and the first power source conductor plane 11 are directly connected to each other by a connecting conductor 111 of a via or the like. In contrast to this, in Embodiment 1, the second power source conductor plane 12 is connected to the first power source conductor plane 11 through the first terminal 9a of the capacitor element 9. The point of difference is only this point.

With respect to Embodiment 1 and Comparative Example, calculation was made under simulation conditions which were shown below. The input port is set between the first via 21 and the fifth via 24 to which a power source pin and a ground pin of the semiconductor device 8 are connected, respectively. The distance between the centers is 1 mm. In addition, the output port is arranged at a position 5 mm apart from the short side which is a distant side from the semiconductor device 8, and is set between the via 17 the other end of which is connected to the first power source conductor plane 11 and the via 18 the other end of which is connected to the ground conductor plane 13. By using such a model, a transfer impedance Z21 was obtained with a 50Ω system, which is one element of the impedance matrix. Z21 is a parameter which combines a noise current I1 with a noise voltage V2 that is generated between the ground conductor plane 13 and the first power source conductor plane 11 by the noise current I1, and is represented by Formula (2).

$$V2=Z21 \times I1 (I2=0) \tag{2}$$

Figure 3B:
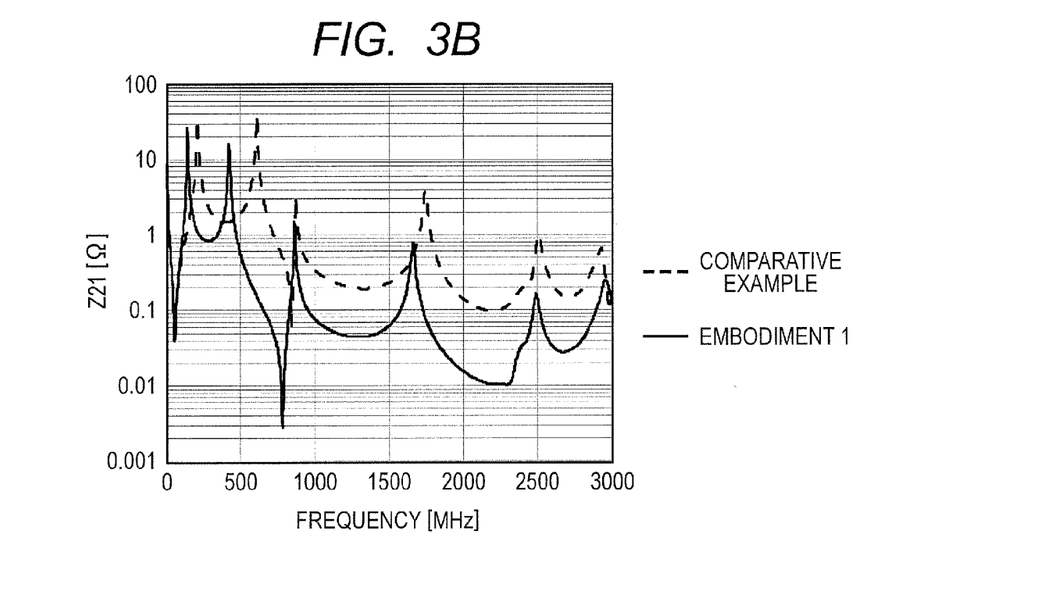

A simulation result for the printed circuit board 1A in Embodiment 1 and a simulation result for the printed circuit board 101 in Comparative Example are illustrated in FIG. 3B. In FIG. 3B, a horizontal axis represents a frequency, a vertical axis represents a transfer impedance Z21, a solid line shows the result in Embodiment 1, and a dashed line shows the result in Comparative Example. As is apparent from FIG. 3B, it is understood that the transfer impedance Z21 of the printed circuit board 1A in Embodiment 1 is as low as approximately one-tenth compared with that of the printed circuit board 101 in Comparative Example, at the maximum. This result shows that a noise voltage generated in the output port by the noise current generated in the input port becomes small by 20 dB. In other words, it is understood that the propagation of the noise current to the whole printed circuit board 1 is reduced by adopting the structure of the printed circuit board 1A in Embodiment 1. It is also understood from the result of FIG. 3B that the electromagnetic radiation noise can be reduced in the frequency band of 500 MHz or more.

Example 2

Figure 4A:
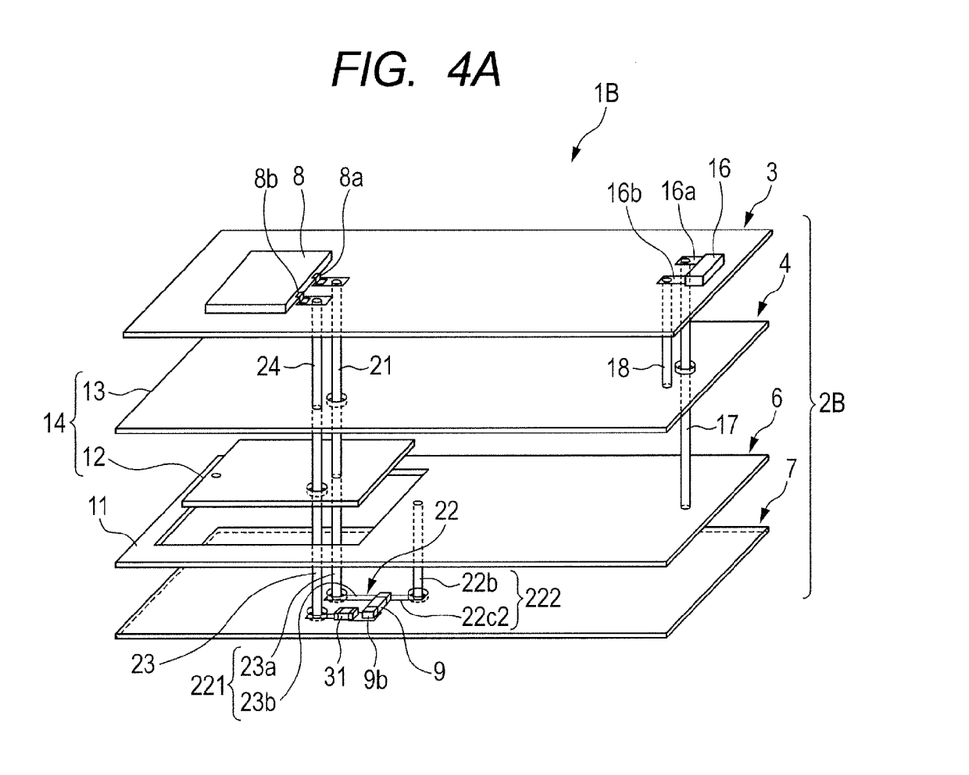
FIGS. 4A and 4B are respectively an exploded perspective view illustrating a printed circuit board according to Embodiment 2, and a graph illustrating a simulation result.

FIG. 4A is an exploded perspective view illustrating a printed circuit board according to Embodiment 2 of the present invention. Incidentally, configurations similar to those in the above-described embodiment and the above-described embodiments are designated by the same reference numerals, and the detailed description will be omitted. In the above-described Embodiment 1, as illustrated in FIG. 3B, an effect of reducing noise propagation locally decreases with respect to Comparative Example, at 138 MHz and 420 MHz. This cause originates from a parallel resonance of a capacitor element 9 and an inductance of the second connecting conductor 22, and a frequency at which an electric current flowing into the capacitor element 9 increases coincides with the frequency at which the effect of reducing the noise propagation decreases.

For this reason, in Embodiment 2, the printed circuit board 1B has a resistor element 31 provided therein which is mounted on a fourth wiring layer 7 of the printed circuit board 2B and is serially connected to the capacitor element 9. The second terminal 9b of the capacitor element 9 is connected to the third connecting conductor 23 through the resistor element 31.

Figure 4B:
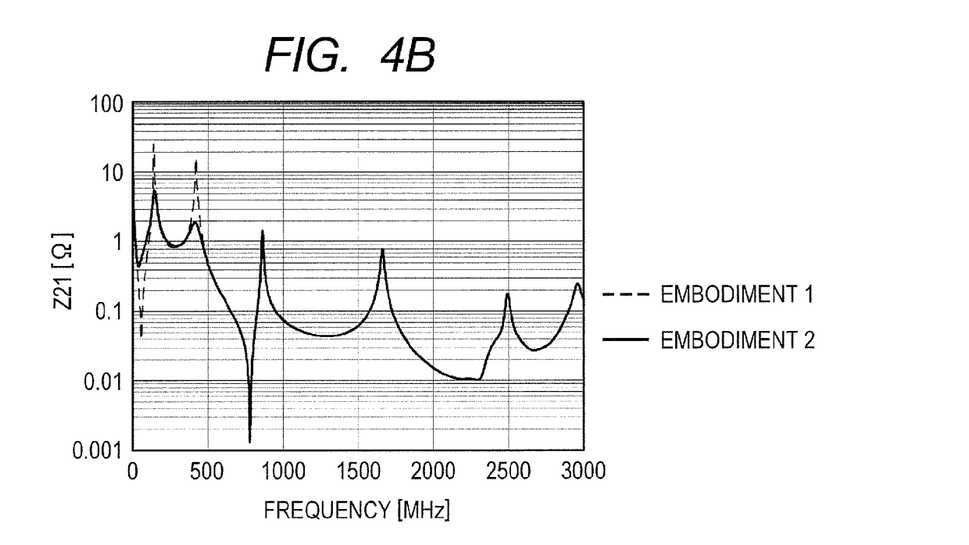

FIG. 4B illustrates a simulation result of the printed circuit board according to Embodiment 2. It is understood from FIG. 4B that the energy of the anti-resonance which is formed by the capacitor element 9 and the second connecting conductor 22 can be decreased more than that in Embodiment 1, by the resistor element 31 which has been serially inserted into the capacitor element 9. In addition, a resistance value of the resistor element 31 to be inserted is desirably 5Ω or less. The reason is because the effect of reducing the noise propagation by the capacitor element 9 results in being impaired if the resistor element with a resistance value higher than the impedance between a second power source conductor plane 12 and a ground conductor plane 13 is inserted.

As has been described above, the printed circuit board 1B of the present embodiment 2 has an effect of decreasing the antiresonance caused by the capacitor element 9 and the second connecting conductor 22 in a frequency band of 500 MHz or less, due to the resistor element 31 which has been serially inserted to the capacitor element 9. Incidentally, even though the connecting order of the capacitor element 9 and the resistor element 31 is reversed, the effect of reducing the noise propagation is not affected thereby.

Example 3

Figure 5A:
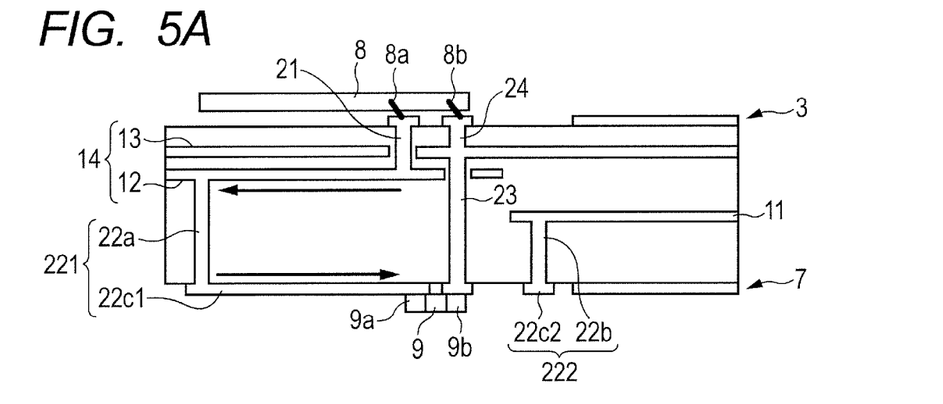
FIGS. 5A, 5B and 5C are respectively a cross-sectional view illustrating a printed circuit board according to Embodiment 3, and a graph illustrating a simulation result.
Figure 5B:
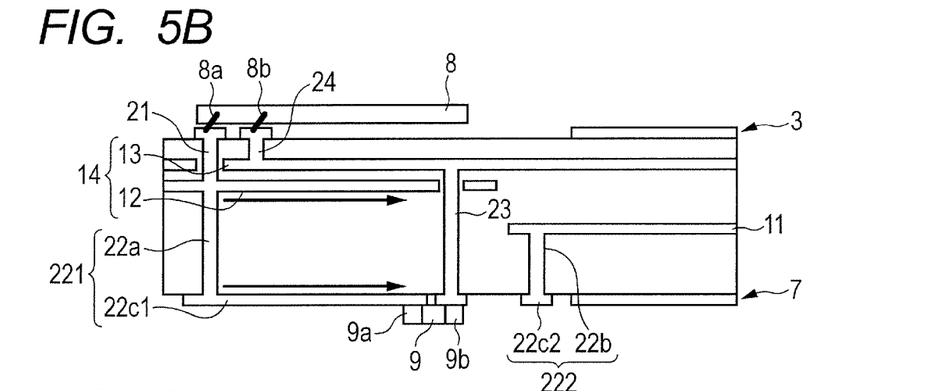

FIG. 5A and FIG. 5B are cross-sectional views illustrating a printed circuit board according to Embodiment 3 of the present invention. Embodiment 3 will be described with reference to FIG. 5A and FIG. 5B. Incidentally, configurations similar to those in the above-described embodiments are designated by the same reference numerals, and the detailed description will be omitted. As has been described above, in order to directly pass more noise electric current to a planar capacitor 14, it is effective to increase the inductance Lv1 of the connection portion 221 which connects the second power source conductor plane 12 with the capacitor element 9.

As a method for increasing the inductance Lv1 of the connection portion 221, it is considered to extend a wiring pattern 22c1. However, when the wiring pattern 22c1 faces to the second power source conductor plane 12, a mutual inductance M between the second power source conductor plane 12 and the wiring pattern 22c1 cannot be neglected.

In the structure illustrated in FIG. 5A, the first via 21 to which the power source pin 8a of the semiconductor device 8 that has been mounted on the first wiring layer 3 is connected is connected to the second power source conductor plane 12. The first via 21 is connected by the second via 22a, to the wiring pattern 22c1 to which the first terminal 9a of the capacitor element 9 that has been mounted on the fourth wiring layer 7, from the connection point on the second power source conductor plane 12 through the furthest position from the connection point on the second power source conductor plane 12. In addition, the second terminal 9b of the capacitor element 9 and the ground pin 8b of the semiconductor device 8 are connected to the ground conductor plane 13.

On the other hand, the structure illustrated in FIG. 5B is the structure of the printed circuit board illustrated in Embodiment 1. The first via 21 to which the power source pin 8a of the semiconductor device 8 that has been mounted on the first wiring layer 3 is connected to the second power source conductor plane 12. The first via 21 is connected by the second via 22a to the wiring pattern 22c1, to which the first terminal 9a of the capacitor element 9 that has been mounted on the fourth wiring layer 7 is connected, at the connection point on the second power source conductor plane 12. In addition, the second terminal 9b of the capacitor element 9 and the ground pin 8b of the semiconductor device 8 are connected to the ground conductor plane 13.

In the structure illustrated in FIG. 5A, the direction of the current flowing on the second power source conductor plane 12 is opposite to the direction of the current flowing on the wiring pattern 22c1 to which the first terminal 9a of the capacitor element 9 is connected. In contrast to this, in the structure of Embodiment 1 illustrated in FIG. 5B, the current flows in the same direction.

Figure 5C:
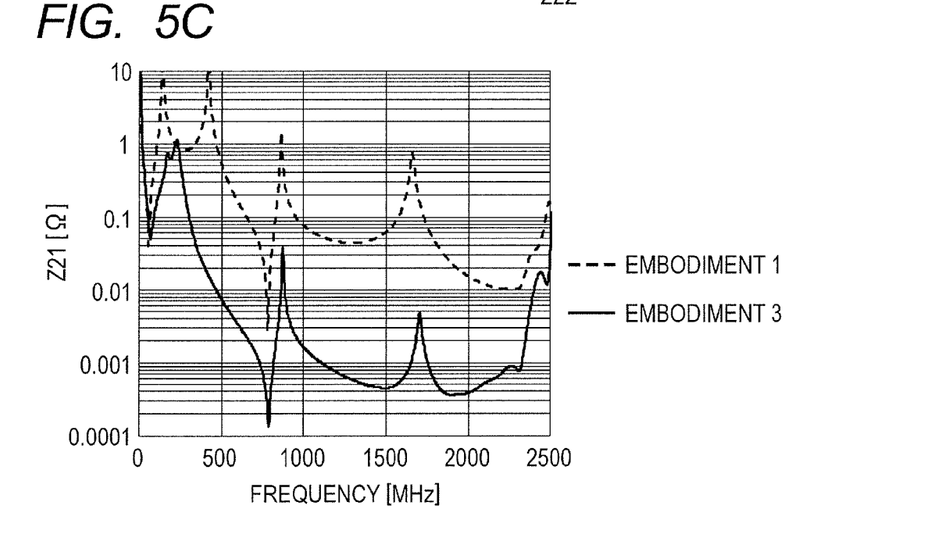

FIG. 5C illustrates a simulation result of the printed circuit board according to Embodiment 3 of the present invention. It is understood from FIG. 5C that the noise propagation toward the whole printed circuit board can be more reduced than that in Embodiment 1, due to the configuration in which the direction of the current flowing on the second power source conductor plane 12 is opposite to the direction of the current flowing on the wiring pattern 22c1 to which the first terminal 9a of the capacitor element 9 is connected.

In Embodiment 3, the capacitor element 9 is arranged on the first via 21 side of a perpendicular bisector of a line that connects the first via 21 to which the power source pin 8a of the semiconductor device 8 is connected, with the second via 22a for connecting the second power source conductor plane 12 with the capacitor element 9. Thereby, an effect of not hindering the current from flowing on the second power source conductor plane 12 is exerted.

Example 4

Figure 6A:
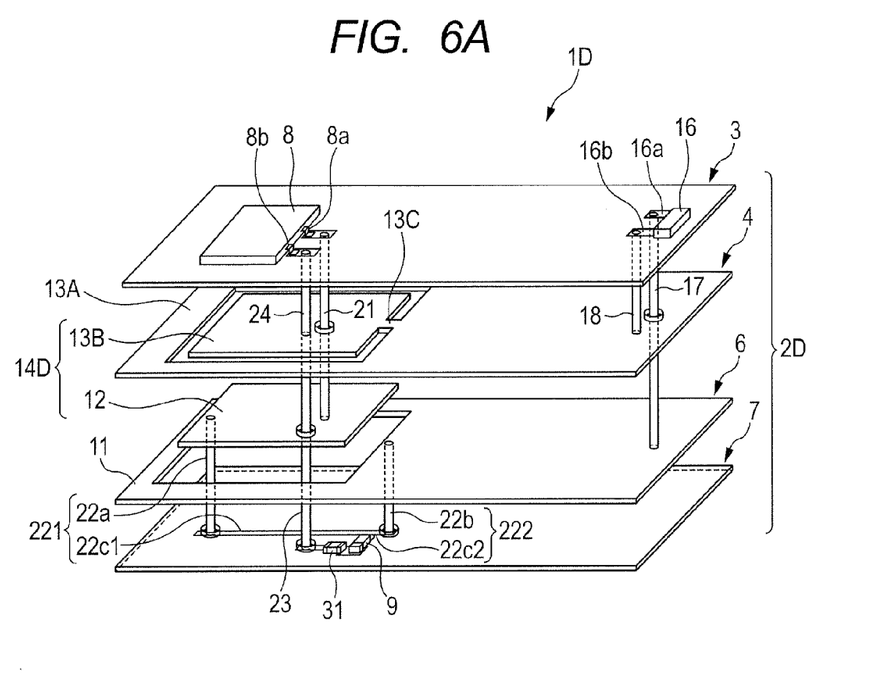
FIGS. 6A and 6B are respectively an exploded perspective view illustrating a printed circuit board according to Embodiment 4, and a graph illustrating a simulation result.

FIG. 6A is an exploded perspective view illustrating a printed circuit board according to Embodiment 4 of the present invention. Incidentally, configurations similar to those in the above-described embodiments are designated by the same reference numerals, and the detailed description will be omitted. In the printed circuit board 1D of Embodiment 4, a ground conductor plane on a ground conductor layer 4 of the printed circuit board 2D is formed of first and second ground conductor planes 13A and 13B which are arranged with a space to each other.

The second ground conductor plane 13B is arranged so as to oppose to the second power source conductor plane 12. In Embodiment 4, a range of a projecting image when the second power source conductor plane 12 is projected onto the ground conductor layer 4 is determined to be the second ground conductor plane 13B. In addition, an aperture portion which is larger than the second ground conductor plane 13B is formed in the first ground conductor plane 13A so as to surround the second ground conductor plane 13B. Thereby, the first ground conductor plane 13A and the second ground conductor plane 13B are separated on the same layer. A gap between the first ground conductor plane 13A and the second ground conductor plane 13B was set to 2 mm.

In addition, a planar capacitor 14D is formed by the second power source conductor plane 12 and the second ground conductor plane 13B by the configuration in which the second power source conductor plane 12 opposes to the second ground conductor plane 13B.

The first ground conductor plane 13A and the second ground conductor plane 13B are connected by a conductor 13C. The conductor 13C which connects the first ground conductor plane 13A with the second ground conductor plane 13B works as a high-impedance element. Furthermore, the conductor 13C is arranged at the position which diagonally opposes to the second via 22a for connecting the second power source conductor plane 12 with the capacitor element 9. By the arrangement as in the above, the direction of an electric current flowing on the second power source conductor plane 12 becomes opposite to the direction of an electric current flowing on the second ground conductor plane 13B, and an effect of directly passing the noise is further enhanced.

Figure 6B:
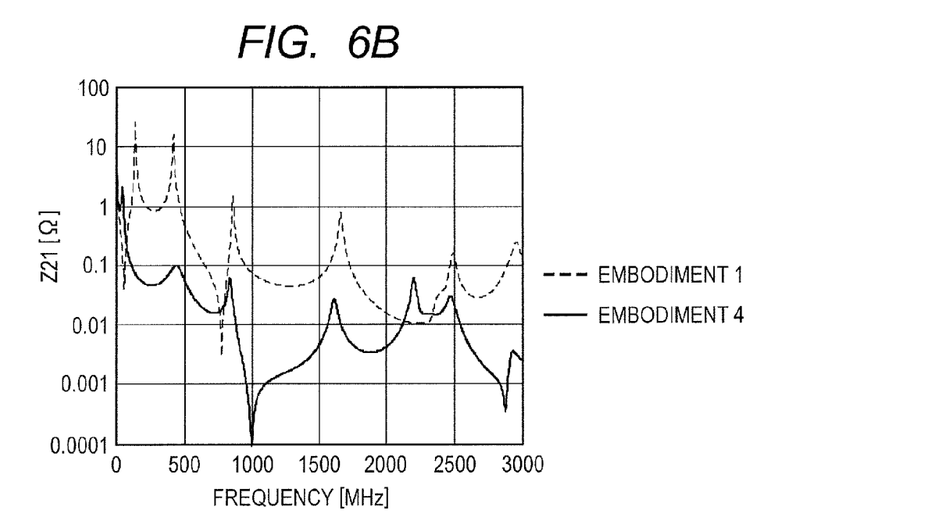

FIG. 6B illustrates a simulation result of the printed circuit board 1D according to Embodiment 4 of the present invention. In FIG. 6B, a horizontal axis represents a frequency, a vertical axis represents a transfer impedance Z21, a solid line shows the result in Embodiment 5 and a dashed line shows the result in Embodiment 1. It is understood from FIG. 6B that the noise propagation toward the whole printed circuit board 1D can be reduced more than that of Embodiment 1, by the configuration in which the ground conductor plane is separated into the first ground conductor plane 13A and the second ground conductor plane 13B.

As has been described above, the printed circuit board 1D of the present embodiment 4 has such a configuration that the ground conductor plane is separated into the first and the second ground conductor planes 13A and 13B which are connected by the conductor 13C. With this configuration, the planar capacitor 14D which is formed by the separated second power source conductor plane 12 and the separated second ground conductor plane 13B functions so as to enhance the decoupling function. Accordingly, the configuration exerts an effect of further reducing the noise propagation toward the whole printed circuit board.

Example 5

Figure 7A:
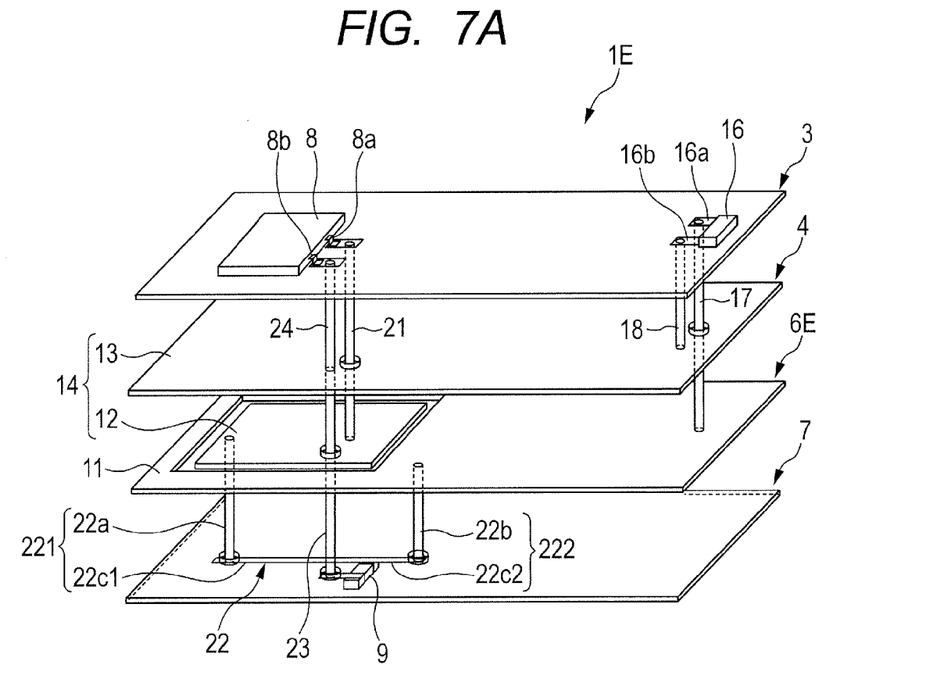
FIGS. 7A and 7B are respectively an exploded perspective view illustrating a printed circuit board according to Embodiment 5, and a graph illustrating a simulation result.

FIG. 7A is an exploded perspective view illustrating a printed circuit board according to Embodiment 5 of the present invention. Incidentally, configurations similar to those in the above-described embodiments are designated by the same reference numerals, and the detailed description will be omitted. In Embodiment 5, the first power source conductor plane 11 of the above-described Embodiment 1 is formed in the same layer 6E as the layer in which the second power source conductor plane 12 is formed.

The distance between the ground conductor plane 13 and the first and the second power source conductor planes 11 and 12 was set at 0.1 mm. Thus, not only the second power source conductor plane 12 but also the first power source conductor plane 11 is arranged so as to closely face to the ground conductor plane 13, and thereby the electrostatic capacitance formed between the first power source conductor plane 11 and the ground conductor plane 13 increases. Thereby, the electrostatic capacitance between the ground conductor layer 4 and the third wiring layer 6E increases and a parasitic inductance component between the planes decreases; and accordingly, the circuit functions as a low-pass filter to enhance the effect of directly passing the noise current therethrough.

Figure 7B:
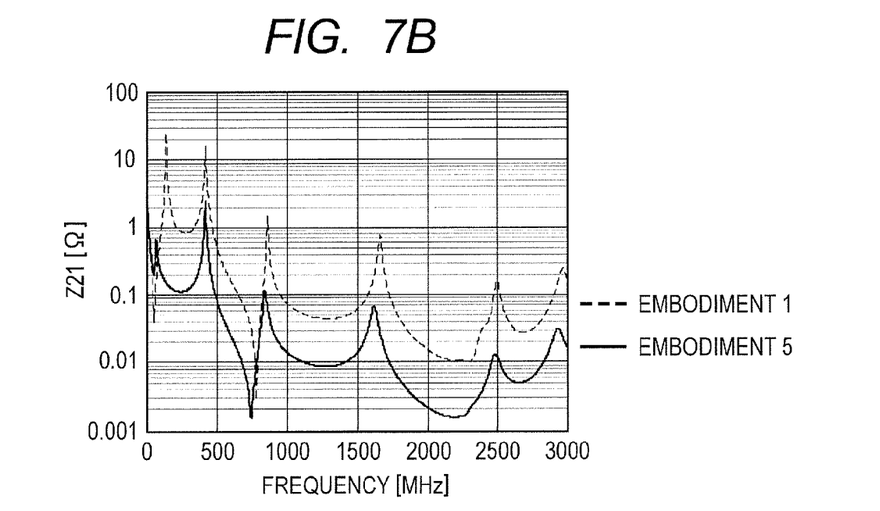

FIG. 7B illustrates a simulation result of the printed circuit board according to Embodiment 5 of the present invention. In FIG. 7B, a horizontal axis represents a frequency, a vertical axis represents a transfer impedance Z21, a solid line shows the result in Embodiment 5 and a dashed line shows the result in Embodiment 1. It is understood from the simulation result of FIG. 7B that the noise propagation toward the whole printed circuit board can be reduced more than that of Embodiment 1 by the configuration in which the third wiring layer 6E is arranged closely to the ground conductor plane 13.

Incidentally, the present invention is not limited to the embodiments described above, and can be variously modified within the technological idea of the present invention by those who have an ordinary knowledge in the field.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-268724, filed Dec. 8, 2011 and Japanese Patent Application No. 2012-265210, filed Dec. 4, 2012 which are hereby incorporated by reference herein in their entirety.

The invention claimed is:

1. A printed circuit board comprising:
a semiconductor device having a power source terminal and a ground terminal; and
a printed wiring board on which the semiconductor device is mounted,
wherein the printed wiring board comprises:
a first wiring layer formed, as being a first surface layer of the printed wiring board, on which the semiconductor device is mounted;
a second wiring layer having a first ground conductor plane to which the ground terminal is connected;
a third wiring layer formed from at least one layer having a first power source conductor plane to which a direct power source voltage is applied, and a second power source conductor plane arranged so as to be arranged with a space from the first power source conductor plane in opposition to the first ground conductor plane, such that the second power source conductor plane and the first ground conductor plane form a planner capacitor;
a fourth wiring layer formed on the printed wiring board at a second surface layer which is a back side surface of the first surface layer; and
a capacitor element mounted on the fourth wiring layer, wherein a first terminal of the capacitor is electrically connected to the power source terminal and a second terminal of the capacitor is electrically connected to the ground terminal,
wherein the power source terminal and the second power source conductor plane are connected through a first connecting conductor,
the second power source conductor plane and the first power source conductor plane are connected through a second connecting conductor,
the first terminal of the capacitor is electrically connected to the second connecting conductor, and the second terminal of the capacitor is electrically connected through a third connecting conductor to the first ground conductor plane, and
the ground terminal is electrically connected through a fourth connecting conductor to the first ground conductor plane, and wherein:
the first connecting conductor comprises a first via through which the first wiring layer and the second power source conductor plane are connected electrically,
the second connecting conductor comprises a second via through which the fourth wiring layer and the second power source conductor plane are connected electrically, a third via through which the fourth wiring layer and the first power source conductor plane are connected electrically, and a wiring pattern formed on the fourth wiring layer for connecting the second via to the third via,
the third connecting conductor comprises a fourth via through which the fourth wiring layer and the first ground conductor plane are connected electrically,
and the fourth connecting conductor comprises a fifth via through which the first wiring layer and the first ground conductor plane are connected electrically.

2. The printed circuit board according to claim 1, wherein a dielectric layer arranged between the first ground conductor plane and the second power source conductor plane has a thickness not larger than 200 μm and a dielectric constant of 4.2.

3. The printed circuit board according to claim 1, wherein the third wiring layer is formed from a single wiring layer, the first power source conductor plane covers a range of a projection image of the semiconductor device projected through the printed wiring board.

4. The printed circuit board according to claim 1, wherein the first via and the second via are formed into a single via penetrating the printed wiring board.

5. The printed circuit board according to claim 1, wherein the third via and the fourth via are formed into a single via penetrating the printed wiring board.

6. A printed wiring board comprising:
a first wiring layer, on which a semiconductor device is to be mounted, as being a first surface layer of the printed wiring board, having a land for a first power source terminal of the semiconductor device and a land for a first ground terminal of the semiconductor device;
a second wiring layer having a first ground conductor plane to which the land for the first ground terminal is connected;
a third wiring layer formed from at least one layer having a first power source conductor plane to which a direct power source voltage is applied, and a second power source conductor plane arranged so as to be arranged with a space from the first power source conductor plane in opposition to the first ground conductor plane, such that the second power source conductor plane and the first ground conductor plane form a planner capacitor; and
a fourth wiring layer formed on the printed wiring board at a second surface layer which is a back side surface of the first surface layer, and having a land for a second power source terminal and a land for a second ground terminal formed thereon for mounting a capacitor element or a series circuit of a capacitor element and a resistor element,
wherein the land for the first power source terminal and the second power source conductor plane are connected through a first connecting conductor,
the second power source conductor plane and the first power source conductor plane are connected through a second connecting conductor,
the land for the second power source terminal is electrically connected to the second connecting conductor, the land for the second ground terminal is electrically connected through a third connecting conductor to the first ground conductor plane,
and the first ground terminal is electrically connected through a fourth connecting conductor to the first ground conductor plane, and wherein:
the first connecting conductor comprises a first via through which the first wiring layer and the second power source conductor plane are connected electrically, the second connecting conductor comprises a second via through which the fourth wiring layer and the second power source conductor plane are connected electrically and a third via through which the fourth wiring layer and the first power source conductor plane are connected electrically, and a wiring pattern formed on the fourth wiring layer for connecting the second via to the third via,
the third connecting conductor comprises a fourth via through which the fourth wiring layer and the first ground conductor plane are connected electrically, and
the fourth connecting conductor comprises a fifth via through which the first wiring layer and the first ground conductor plane are connected electrically.

7. The printed wiring board according to claim 6, wherein a dielectric layer arranged between the first ground conductor plane and the second power source conductor plane has a thickness not larger than 200 μm and a dielectric constant of 4.2.

8. The printed wiring board according to claim 6, wherein the first via and the second via are formed into a single via penetrating the printed wiring board.

9. The printed wiring board according to claim 6, wherein the third via and the fourth via are formed into a single via penetrating the printed wiring board.

* * * * *